United States Patent [19]

Dirks et al.

[11] Patent Number: 5,280,411
[45] Date of Patent: Jan. 18, 1994

[54] PACKAGING FOR AN ELECTRONIC CIRCUIT BOARD

[75] Inventors: Gregory J. Dirks; Mark V. Muller, both of San Antonio, Tex.

[73] Assignee: Southwest Research Institute, San Antonio, Tex.

[21] Appl. No.: 59,817

[22] Filed: May 10, 1993

[51] Int. Cl.⁵ .............................................. H05K 7/20
[52] U.S. Cl. ................... 361/707; 361/715; 361/720; 361/728; 361/752; 165/185
[58] Field of Search ............... 165/80.3, 185; 174/16.3; 361/383, 386-389, 392, 394-395, 399, 415, 417-420

[56] References Cited

U.S. PATENT DOCUMENTS

| | | | |
|---|---|---|---|
| 3,631,325 | 12/1971 | Wenz | 317/100 |
| 3,689,804 | 9/1972 | Ishihama et al. | 317/100 |
| 4,072,378 | 2/1978 | Lockbrunner | 339/17 |
| 4,330,812 | 5/1982 | Token | 361/386 |
| 4,468,717 | 8/1984 | Mathias et al. | 361/382 |
| 4,513,354 | 4/1985 | Abel | 361/399 |
| 4,602,314 | 7/1986 | Broadbent | 361/386 |
| 4,716,498 | 12/1987 | Ellis | 361/386 |
| 4,730,232 | 3/1988 | Lindberg | 361/392 |
| 4,731,698 | 3/1988 | Millot et al. | 361/386 |
| 4,771,365 | 8/1988 | Cichocki et al. | 361/387 |
| 4,778,626 | 11/1988 | Neidig et al. | 361/386 |
| 4,915,167 | 4/1990 | Altoz | 165/185 |
| 4,916,575 | 4/1990 | Van Asten | 361/388 |
| 4,965,699 | 10/1990 | Jorden et al. | 361/387 |
| 5,060,114 | 10/1991 | Feinberg et al. | 361/387 |

Primary Examiner—Gregory D. Thompson
Attorney, Agent, or Firm—Baker & Botts

[57] ABSTRACT

A packaging for conventional printed circuit boards for protecting them from both thermal and mechanical stress. Heat conducting rails are attached to the edges of the card, and heat conducting leads used to connect heat generating components on the card to the rails. A support plate provides a rigid outer surface for the bottom of the card, with a shock absorbing layer sandwiched between the support plate and the bottom surface of the card. A heat conductive coating over the top surface of the card and its components acts as an additional heat sink.

20 Claims, 1 Drawing Sheet

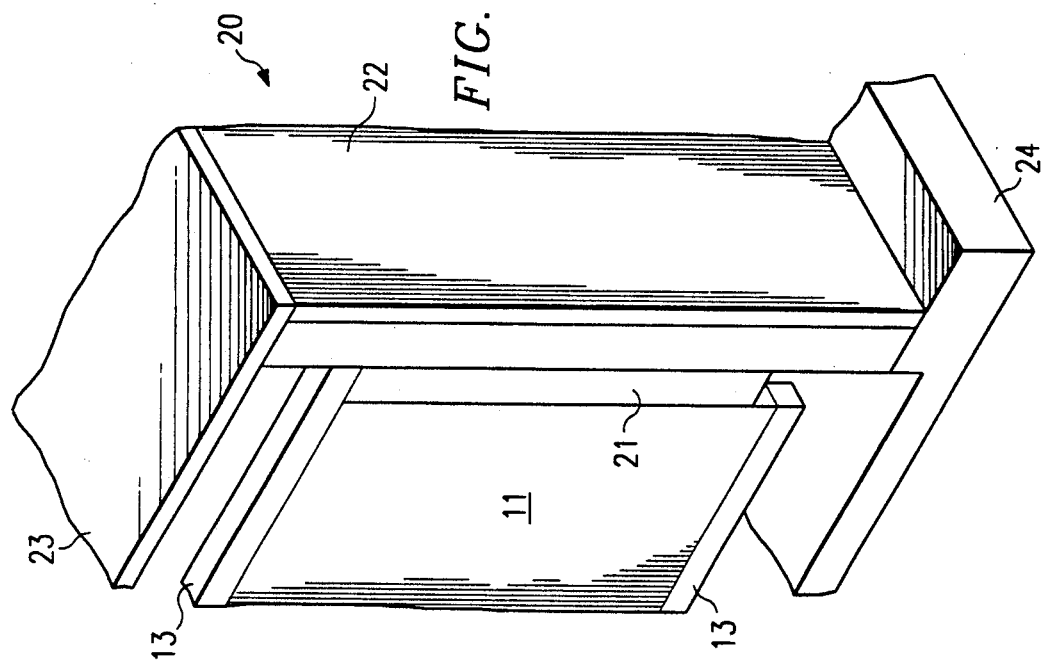
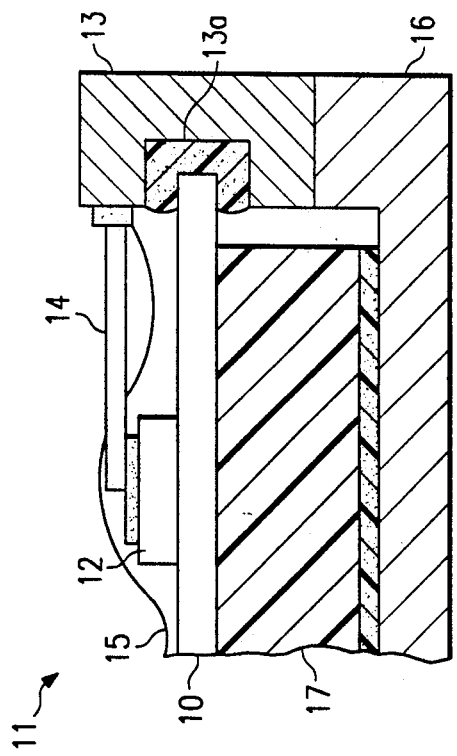
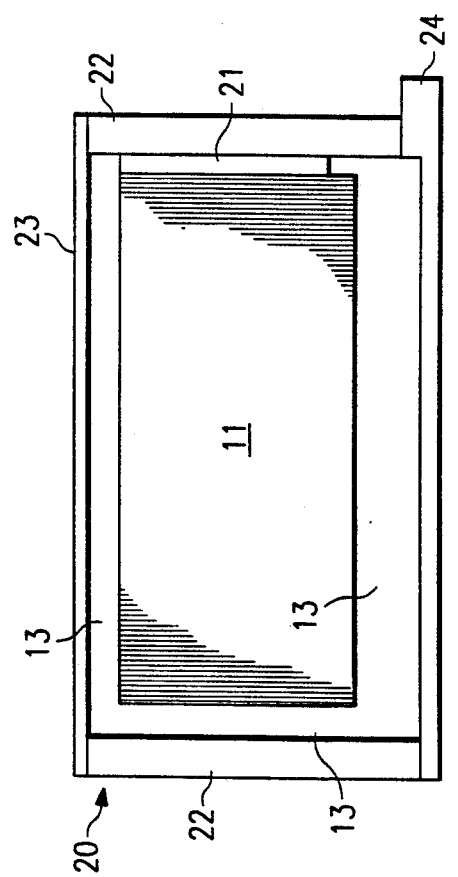

PACKAGING FOR AN ELECTRONIC CIRCUIT BOARD

TECHNICAL FIELD OF THE INVENTION

This invention relates to packaging for electronic circuitry, and more particularly to packaging that decreases performance problems due to temperature and mechanical stress.

BACKGROUND OF THE INVENTION

Commercial printed circuit cards are attractive because of their low cost, availability, and standard electrical and mechanical configuration. However, most electronic circuit boards are designed for use in fairly benign environments, such as inside a computer or television. Typically, heat transfer is by means of either forced or free convection, and there is no significant vibration.

For use in environments where convection is not available for heat transfer or where significant mechanical stress can be expected, it is necessary to enhance the thermal and dynamic characteristics of the printed circuit board.

A common technique for improving the thermal characteristics of a printed circuit board is the use of a heat sink to which heat is conducted. U.S. Pat. No. 4,731,698, U.S. Pat. No. 4,602,314, U.S. Pat. No. 4,468,717, U.S. Pat. No. 4,330,812, U.S. Pat. No. 3,631,325 discuss such techniques.

Stress on printed circuit boards has been controlled to some extent by means of limiting the board size or by using stiffeners. This raises the natural vibrational frequency of the board. U.S. Pat. No. 3,689,804 describes the use of a flexible layer between a circuit board and its housing to prevent cracking of the board or its circuits.

A problem with existing packaging techniques is that they are directed to either protection from heat or stress, but not both. A need exists for a circuit board packaging that performs both functions.

SUMMARY OF THE INVENTION

A first aspect of the invention is a circuit card module, which provides heat conduction from heat-generating components mounted on a printed circuit card, and also provides protection from mechanical stress. A heat conducting rail is attached to each of two opposing edges of the card. A support plate is placed across the bottom surface of the card and is spaced apart from the card. A layer of shock absorbing material is sandwiched between the bottom surface of the card and the top surface of the support plate. A heat conducting lead has one end attached to a heat generating component and the other end attached to one of the rails. A heat conductive coating is applied to the top surface of the card, to cover the top surface as well as the component. The module may be placed in an outer housing that provides further heat sinking and mechanical stress protection functionality.

A technical advantage of the invention is that it permits circuit boards to be used in severe environments, such as might be encountered for military use or during spaceflight.

BRIEF DESCRIPTION OF THE DRAWINGS

FIG. 1 is a cross sectional view of one end of a printed circuit card packaged in accordance with the invention to form a card module.

FIG. 2 illustrates the module of FIG. 1 in a housing, which provides further heat sinking capability and protection against mechanical stress.

FIG. 3 illustrates an alternative embodiment of the module and housing.

DETAILED DESCRIPTION OF THE INVENTION

FIG. 1 is a cross sectional view of one end of a printed circuit card 10, packaged in accordance with the invention to form a card module 11. Card 10 may be any type of circuit card, including those that are commercially available.

Although a typical card 10 might have many components mounted on it, FIG. 1 shows only a single component 12 mounted on its top surface. Component 12 may be any type, including "through hole" or surface mounted. For surface mounting, a silicon adhesive may be used between card 10 and component 12.

The following description is in terms of both the structural elements of card module as well as the process steps used to make it. The order in which each element is described is the same as the order in which the manufacturing step(s) for that element would occur.

Thus, the edge of card 10 is first bonded to a heat conducting rail 13. In the preferred embodiment, rail 13 is made from a material that is both rigid and heat conducting. A suitable material would be a metal having these properties, with the preferred material being aluminum. Ideally, rail 13 has a channel 13a into which the edge of card 10 is inserted.

Bonding of card 10 to rail 13 is by means of a heat conducting adhesive. In the preferred embodiment, bonding is by means of an epoxy such as ECCOBOND 285, a product manufactured by Emerson & Cumming, Inc.

In FIG. 1, a single rail 13 along one side of card 10 is shown. A second rail 13 will be similarly bonded to the opposing side of card 10. If it is assumed that card 10 has a standard edge connector (not shown) along one edge, card 10 could have rails 13 along the other three edges, as explained below in connection with FIG. 2. In general, because each rail 13 is rigid, it limits deflection of card 10 and thereby reduces solder joint stress.

Next, heat-producing components mounted on card 10, such as component 12, are selected to be thermally coupled to one of rails 13. This coupling is accomplished with a heat conducting lead 14, such as a with a metal strip, wire, or braid. The preferred metal is copper.

Each lead 14 is bonded to component 12 and to rail 13 with a heat conducting adhesive. In the preferred embodiment, this bonding is accomplished with a silicon adhesive, such as CV2942, a product manufactured by McGhan NuSil Corp.

A conformal coating 15 is then applied to the top surface of card 10 and over component 12, so as to completely cover both card 10 and component 12. Although coating 15 serves a protective purpose, it can be made heat conducting so further serve a heat sinking purpose.

To enhance the heat sinking function of coating 15, it is sufficiently thick to ensure that at least a part of the inside surface of rail 13 is coated. Typically, coating 15 will be about 0.02 inches thick. In the preferred embodiment, coating 15 is a commercially available material known as CONATHANE, manufactured by CONAP. As a result of coating 15, heat will be conducted from the surface of card 10 to rails 15.

A support plate 16 is made of a heat conducting material. It has a flat shape and an area that is slightly larger than the bottom area of card 10. Support plate 16 has a lip around its periphery, which extends upward to meet rails 13. In the preferred embodiment, support plate 16 is made from aluminum.

A shock absorbing layer 17 is bonded to the top surface of support plate 16, and has a thickness that will permit the top of layer 17 to contact the bottom of card 10 when support plate 16 is joined to rails 13. The material from which layer 17 is made can be any type of deformable material designed to reduce shock and vibrational stress, and in the preferred embodiment is a material known as PORON, manufactured by Rogers Corp. In the preferred embodiment, layer 17 is bonded to support plate 16 with a pressure sensitive bonding material.

The assembly comprised of support plate 16 and layer 17 is then joined to the assembly comprised of card 10 and rails 13. Although according to the above description, leads 14 and coating 15 are already in place, in an alternate manufacturing process, the steps of placing leads 14 and coating 15 on card 10, or the step of placing coating 15 on card 10, could be performed after the support plate 16 is joined to rails 13.

The result of the steps of FIG. 1 is a card module 11 having heat conductive leads 11 and conductive coating 15 on its top side. Thus, the primary heat transfer from heat generating components is conductive rather than by means of convection. Card module 11 has rails 13 along at least two sides, which serve the dual function of providing a heat sink, and of providing rigidity to card 10 to reduce the effects of stress. Card 10 rests on a shock absorbing layer 17 sandwiched between card 10 and a support plate 16, the latter further serving to further protect card 10 from the effects of mechanical stress.

FIG. 2 illustrates a housing 20, into which card module may be placed for further protection against mechanical stress. Card 10 has an edge connector 21, which extends past support plate 16 so that connector 21 may be inserted into appropriate electrical connections of a side panel 22 of housing 20. These connections are known in the art of printed circuit boards and are not shown in detail herein.

All elements of housing 20 are made from a rigid material, for the purpose of protecting card module 11 from shock. Some or all of the material from which housing 20 is made is also heat conducting to provide additional heat sinking functionality.

Additional side panels 22, but without electrical connections, may be included as part of housing 20. Typically, there will be four side panels 22, so that housing 20 encloses card module 11 all four of its sides. These additional side panels 22 could be spaced apart from top and bottom of card module 11 so as to isolate it from the effects of vibration and other mechanical stress. However, to firmly secure card module 11 within housing 20, and to enhance heat flow from rail 13 to housing 20, the side panel 22 at the edge of card module 11 opposing edge connector 21 could be attached to a rail 13 at that edge.

In addition to side panels 22, housing 20 has a top plate 23 and a baseplate 24. These elements are attached to side panels 22. Like side panels 22, they may be spaced apart from card module 11 to isolate it from vibration. Together with side panels 22, they form a complete enclosure for card module 11.

In the preferred embodiment, at least one rail 13 is attached to a heat conductive inner surface of the base plate 24, top plate 23, or a side panel 22 to provide conductive heat flow from the interior to the exterior of the box. Although not explicitly shown, in the embodiment of FIG. 2, only one rail 13 (the rail 13 on the edge of card 10 opposing edge connector 21) is attached to housing 20.

FIG. 3 illustrates a module 11 having three rails 13, each attached to a side panel 22, top plate 23, or base plate 24. In this embodiment, two additional side panels 22 (not shown) are spaced from module 11.

Other Embodiments

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method of packaging a printed circuit board having at least one heat generating component mounted on its top surface, comprising the steps of:
   attaching each edge of a pair of opposing edges of said board to a respective rail of a pair of rails made from a heat conductive material;
   connecting said heat generating component to at least one of said rails with a heat conducting lead;
   coating said top surface and said component with a heat conductive coating such that at least part of the inner surface of at least one of said rails is covered by said coating;
   placing a shock absorbing layer on the top surface of a support plate; and
   joining said rails to edges of said support plate, such that said shock absorbing layer is sandwiched between said support plate and the bottom surface of said board.

2. The method of claim 1, wherein said connecting step and said coating step are performed prior to said placing and joining steps.

3. The method of claim 1, wherein said connecting step and said coating step are performed after said placing and joining steps.

4. The method of claim 1, wherein said attaching step is performed with a heat conducting material.

5. The method of claim 1, wherein said connecting step is accomplished by bonding said lead to at least one of said rails a heat conducting material.

6. The method of claim 1, further comprising the step of connecting at least one of said rails to an inner heat conductive surface of a housing.

7. A printed circuit card module, comprising:
   a printed circuit card having at least one heatgenerating component mounted on its top surface;
   at least two heat conductive rails, each attached to an edge of said card;

a support plate placed across the bottom surface of said card between said rails and spaced apart from said bottom surface of said card;

a layer of shock absorbing material sandwiched between said bottom surface of said card and the top surface of said support plate;

a heat conducting lead from said component to one of said rails; and a protective coating over said component extending partly over the top surface of said card to at least one of said rails.

8. The module of claim 7, wherein said component is surface mounted.

9. The module of claim 7, wherein said component is through-hole mounted.

10. The module of claim 7, wherein there are two of said heat conductive rails, each attached to an opposing edge of said card.

11. The module of claim 7, wherein said coating covers the entire top surface of said card as well as said component.

12. The module of claim 7, wherein said support plate is made from a heat conducting material.

13. The module of claim 7, wherein each of said rails is rigid as well as heat conducting.

14. The module of claim 7, wherein said coating is heat conductive.

15. An enclosed printed circuit card module, comprising:

a printed circuit card having at least one heatgenerating component mounted on its top surface;

at least two heat conductive rails, each attached to an edge of said card;

a support plate placed across the bottom surface of said card between said rails and spaced apart from said bottom surface;

a layer of shock absorbing material sandwiched between said bottom surface of said card and the top surface of said support plate;

a heat conducting lead from said component to one of said rails;

a protective coating over said component extending over at least a portion of said top surface of said card to at least one of said rails; and a housing for containing all of said above elements, said housing having all or part of its inner surface made from a heat conductive material to which at least one of said rails is attached.

16. The module of claim 15, wherein there are two of said heat conductive rails, each attached to an opposing edge of said card.

17. The module of claim 15, wherein said coating covers the entire top surface of said card as well as said components.

18. The module of claim 15, wherein said support plate is made from a heat conducting material.

19. The module of claim 15, wherein each of said rails is rigid as well as heat conducting.

20. The module of claim 15, wherein said coating is heat conductive.

* * * * *